(12) United States Patent
Fender et al.

(10) Patent No.: US 8,929,162 B1
(45) Date of Patent: Jan. 6, 2015

(54) GATING AND SAMPLING A DATA STROBE SIGNAL USING A SHARED ENABLE SIGNAL

(75) Inventors: Joshua David Fender, East York (CA); Gordon Raymond Chiu, North York (CA); Ryan Fung, Mississauga (CA)

(73) Assignee: Altera Corporation, San Jose, CA (US)

( * ) Notice: Subject to any disclaimer, the term of this patent is extended or adjusted under 35 U.S.C. 154(b) by 224 days.

(21) Appl. No.: 13/531,430

(22) Filed: Jun. 22, 2012

(51) Int. Cl.
*G11C 7/22* (2006.01)
*G11C 7/10* (2006.01)

(52) U.S. Cl.
CPC .................................. *G11C 7/1051* (2013.01)

USPC .......................................................... 365/193

(58) Field of Classification Search
None
See application file for complete search history.

(56) References Cited

U.S. PATENT DOCUMENTS

2009/0240968 A1* 9/2009 Kizer et al. ................... 713/401

* cited by examiner

*Primary Examiner* — James G Norman

(57) ABSTRACT

In a memory interface circuit (e.g., a programmable logic device), a clock or strobe (DQS) signal can be gated using a clock-like signal that can also be used to sample the DQS signal. Furthermore, both the rising and falling edges of the DQS signal can be sampled using the clock-like signal.

18 Claims, 6 Drawing Sheets

GATING AND SAMPLING A DATA STROBE SIGNAL USING A SHARED ENABLE SIGNAL

BACKGROUND

A programmable logic device (PLD) is a configurable integrated circuit used to implement a custom logic function. Examples of PLDs include devices such as, but not limited to, a programmable logic array (PLA), a field programmable gate array (FPGA), and an erasable and complex PLD. PLDs have been used to implement memory interface controllers for memory interfaces such as double data rate (DDR) interfaces employed in synchronous dynamic random access memory (SDRAM), for example.

In a basic DDR implementation, a clock or strobe (DQS) signal is used to control the timing of the transfer of input/output (I/O) data (DQ). The DDR3 specification requires a preamble period, defined as greater than or equal to 90 percent of a clock period, during which the DQS signal is driven low before data transfer. Similarly, after the last falling edge of the DQS signal, the DDR3 specification defines a post-amble period, defined as greater than or equal to 40 percent of the clock period, during which the DQS signal is again driven low. However, the DQS signal has periods of tri-state during which its value is indeterminate (between high and low). The challenge is to gate the DQS signal to periods in which the signal is not tri-stated, to prevent spurious signals from being fed into the physical interface circuitry (PHY) capture and resynchronization logic.

In one conventional implementation, the DQS signal is sampled using the DQS gating enable signal, but this technique can only sample the DQS signal at the end of a read burst (at the end of the period between the preamble and the post-amble). In another conventional implementation, multiple DQS edges are sampled utilizing a free running clock, but this technique requires significant circuit duplication to provide phase control over both the free running clock and the DQS enable signal.

Furthermore, only the rising edge of the DQS signal is conventionally tracked based on samples taken, with the falling edge of the DQS enable signal used for ungating. This enables proper adjustments to be made to the DQS enable signal to track low-frequency variation in round-trip delay that affects the ungating timing window (defined with respect to rising DQS edges). However, because the falling edges of DQS are not tracked, an implicit assumption is made that the DQS enable signal used for gating needs the same adjustments as the signal used for ungating. That is, the memory duty cycle distortion (DCD) variation that affects the relative position of the gating and ungating timing windows is not compensated.

SUMMARY

In embodiments according to the present invention, the DQS signal can be gated using a clock-like signal that can also be used to sample the DQS signal, thus reducing circuit duplication and consequently reducing silicon area. Furthermore, both the rising and falling edges of the DQS signal can be sampled using the clock-like signal, which increases performance by compensating the effect of temperature variation in duty cycle distortion (DCD).

More specifically, in embodiments according to the present invention, a clock-like DQS enable signal is used to enable a falling edge detector gating circuit and enable a sample circuit that can be used to sample falling edges. A second sample circuit can be used to sample rising edges of the DQS enable signal. Invalid samples can be discarded using a counter that tracks the number of invalid samples read. Delay-generating circuitry can be used to generate three versions of the clock-like signal for ungating, gating, and sampling. Settings on a delay-generating element can be toggled between operational settings and sampling settings.

In one embodiment, a memory interface circuit (e.g., a PLD) coupled to a memory device generates a second enable signal (the clock-like signal) using a clock signal and a first enable signal. The second enable signal is useful for gating and ungating the data strobe signal, for sampling rising edges of the second enable signal to track the second enable signal against the data strobe signal, and for sampling falling edges of the second enable signal to track the second enable signal against the data strobe signal.

In one embodiment, the memory interface circuit includes a flip-flop operable to receive the clock signal and to output the first enable signal to a first input of a logic gate, and a signal line that feeds the clock signal directly to a second input of the logic gate. In such an embodiment, the memory interface circuit further includes a delay chain that causes the clock signal to arrive at the logic gate after the first enable signal. The second enable signal is thereby produced from the logic gate according to the first enable signal and the clock signal.

In one embodiment, the memory interface circuit further includes a programmable first delay element coupled to the output of the logic gate. The first delay element has a first setting when the data strobe signal is being gated and a second setting when the rising and falling edges are being tracked. In another such embodiment, the memory interface circuit further includes a programmable second delay element coupled to the output of the logic gate. The second delay element has a first setting when the data strobe signal is being ungated and a second setting when the rising and falling edges are being tracked.

In one embodiment, the memory interface circuit further includes a first up/down counter coupled to a sampling register (or a first phase detector) and operable to track the falling edges, and a second up/down counter coupled to a second sampling register (or a second phase detector) and operable to track the rising edges. The first up/down counter is controlled according to a third enable signal that is generated using the clock signal and the first enable signal and that prevents an invalid sample from being counted.

In one embodiment, instead of using a third enable signal as just described, the memory interface circuit further includes another counter configured to count instances of the first enable signal. The count from this other counter is useful for excluding an invalid sample from a count of the falling edges.

Advantageously, embodiments according to the present disclosure either enable a greater number of samples with comparable area, when compared against DQS gating using an enable signal, or provide an identical number of samples without the need for circuit duplication, when compared against DQS tracking with a free running clock using a mirror path. The ability to enable a greater number of samples in the same amount of time and area can improve the performance of memory calibration and tracking algorithms. The ability to sample from multiple edges of regular read bursts is also a benefit. The reduced amount of logic, clocks, and signals required when compared to conventional solutions also provides a power savings in addition to the area savings.

These and other objects and advantages of the various embodiments of the present invention will be recognized by those of ordinary skill in the art after reading the following detailed description of the embodiments that are illustrated in the various drawing figures.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the embodiments of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Figure 1:
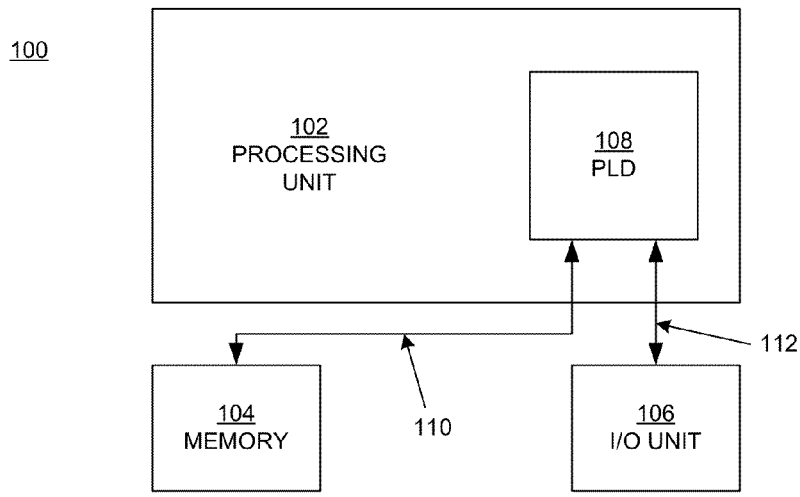
FIG. 1 is a block diagram of a system upon which embodiments according to the present invention can be implemented.

FIG. 1 is a block diagram of a system 100 upon which embodiments according to the present invention can be implemented. The system 100 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, the system 100 may be provided on a single board, on multiple boards, or within multiple enclosures.

In the example of FIG. 1, the system 100 includes a processing unit 102, a memory unit 104, and an I/O unit 106 interconnected by one or more buses. According to this example, a PLD 108 is embedded in the processing unit 102. The PLD 108 may serve many different purposes within the system 100. The PLD 108 can, for example, be a logical building block of the processing unit 102, supporting its internal and external operations. The PLD 108 is programmed to implement the logical functions necessary to carry on its particular role in system operation. An example of a PLD is discussed further in FIG. 8.

The processing unit 102 of FIG. 1 may direct data to an appropriate system component for processing or storage, execute a program stored in the memory 104, or receive and transmit data via the I/O unit 106, or perform some other function. The processing unit 102 can be a central processing unit (CPU), microprocessor, floating point coprocessor, graphics coprocessor, hardware controller, microcontroller, programmable logic device programmed for use as a controller, network controller, and the like. The memory unit 104 may be a random access memory (RAM), read only memory (ROM), fixed or flexible disk media, PC Card flash disk memory, tape, or any other storage means, or any combination of these storage means. The I/O unit 106 may be some type of device other than memory, such as a communication interface (e.g., a network card) or a display adapter (e.g., a video card), for example.

In one embodiment, there is no need for a CPU. For example, instead of a CPU, one or more PLDs 108 can control the logical operations of the system. In such an embodiment, a PLD 108 acts as a reconfigurable processor, which can be reprogrammed as needed to handle a particular computing task. Alternatively, the PLD 108 may itself include an embedded microprocessor.

In one embodiment, the PLD 108 operates as a memory interface circuit or memory controller. In such an embodiment, the PLD 108 can communicate information or data to and from the memory unit 104 and/or the I/O unit 106 via a first set of strobe (DQS) signal and data (DQ) signal lines 110 and a second set of DQS signal and DQ signal lines 112. There may be other lines between the PLD 108 and the memory unit 104 and I/O unit 106. For example, there can be a command line that communicates command bits to the units 104 and 106, to cause those units to perform operations such as read or write operations. There can also be a clock signal line to the units 104 and 106. The DQS signal is used to reliably sample the DQ lines to communicate/transfer data.

Figure 2A:
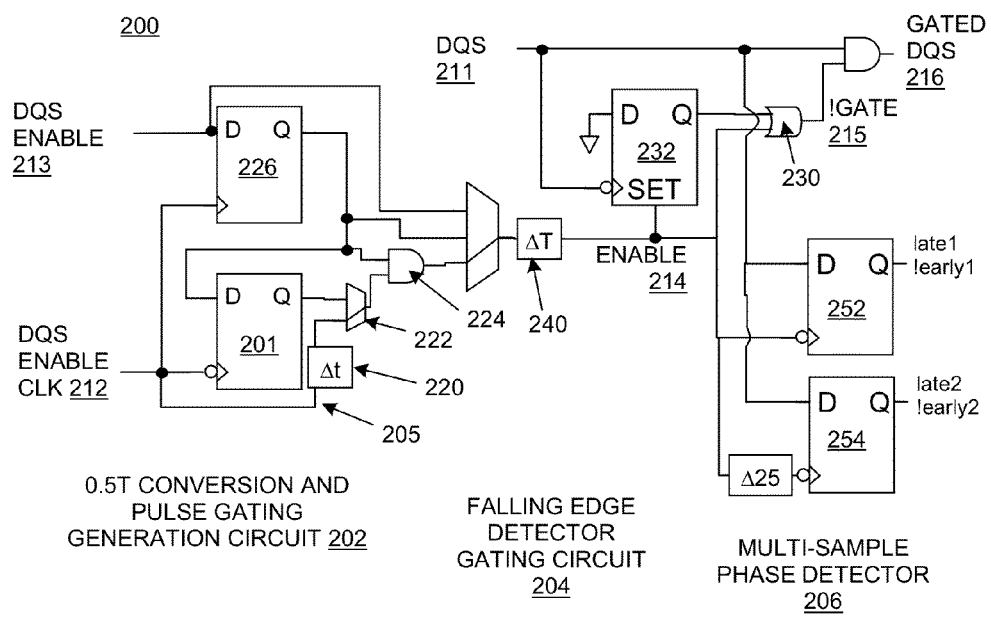
FIG. 2A illustrates tracking and gating circuitry that can be used in, for example, a memory interface circuit (e.g., a PLD) in an embodiment according to the present invention.
Figure 2B:
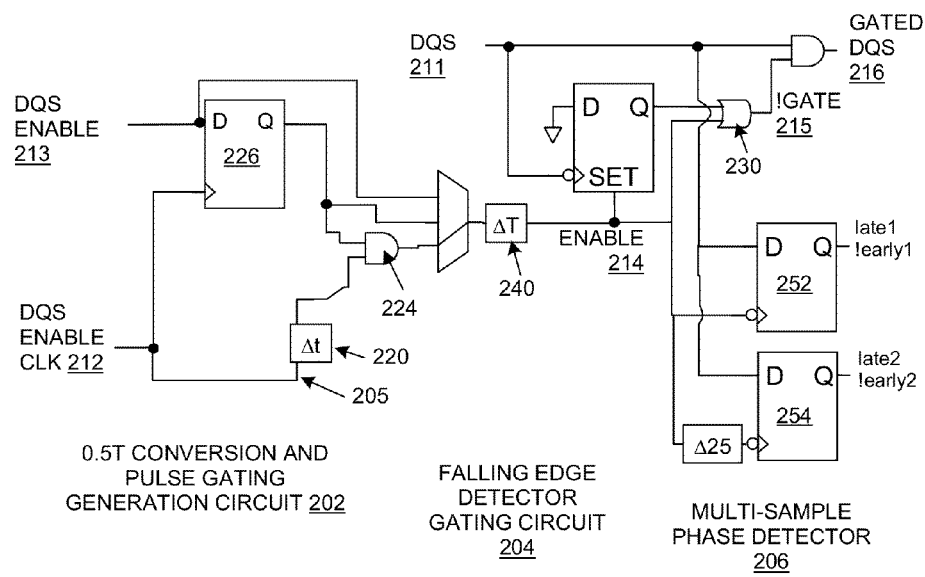
FIG. 2B illustrates tracking and gating circuitry that can be used in, for example, a memory interface circuit (e.g., a PLD) in another embodiment according to the present invention.

FIGS. 2A and 2B illustrate tracking and gating circuitry 200 that can be used in, for example, a memory interface circuit (e.g., PLD 108 of FIG. 1) in embodiments according to the present invention. In FIGS. 2A and 2B, the circuitry 200 includes one-half (0.5) period (T) conversion and pulse gating generation circuit 202, falling edge detector gating circuit 204, and multi-sample phase detector 206.

In the embodiment of FIG. 2A, the 0.5T conversion and pulse gating circuit 202 includes a flip-flop 201. The flip-flop 201 is included in this embodiment to provide support for two different modes of operation: a legacy mode of operation that does not utilize the signal line 205; and a bypass mode of operation that utilizes the signal line 205. In the embodiment of FIG. 2A, the signal line 205 provides a path that bypasses the flip-flop 201. In the embodiment of FIG. 2B, the circuitry 200 does not include the flip-flop 201.

In general, the purpose of the falling edge detector gating circuit 204 is to expand the 0.4T post-amble timing window to a full period T by detecting the last falling edge of the DQS signal 211. The falling edge detector gating circuit 204 is fed a clock-like signal (the enable signal 214) that can also be used to sample every falling edge of the DQS signal 211.

In general, the purpose of the 0.5T conversion and pulse gating circuit 202 is to manipulate the enable signal 214 to properly align the gating circuitry to the 0.9T preamble period. The circuit 202 delays the rising edge of the DQS enable signal 213 by 0.5T to position the assertion of the enable signal 214 to near the center of the preamble period.

The clock-like enable signal 214 is generated by the 0.5T conversion and pulse gating circuit 202. The clock-like signal 214 can be used to gate the DQS signal 211 to produce gated DQS signal 216. As described further in conjunction with the embodiments of FIGS. 4 and 5 below, the enable signal 214 can also be used to sample every falling edge and every rising edge of the DQS signal 211 and can also be used to gate and ungate the DQS signal 211.

Figure 3:
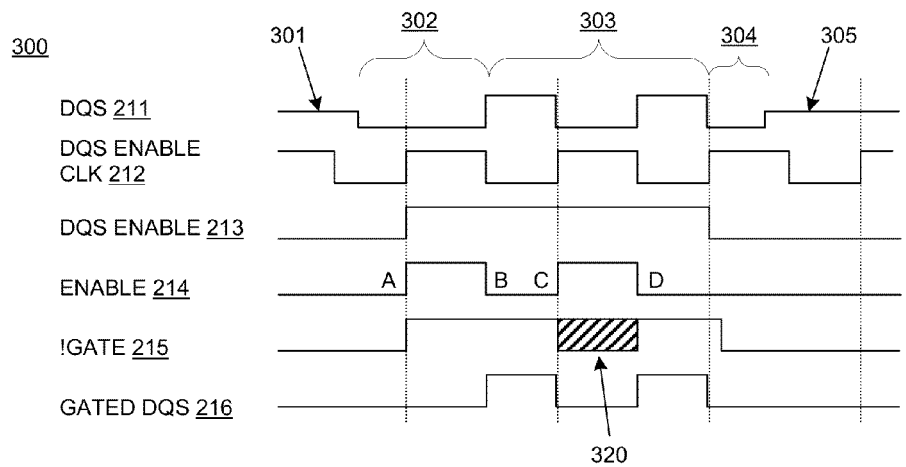
FIG. 3 shows a timing diagram for various signals that can be used in, for example, a memory interface circuit in an embodiment according to the present invention.

FIG. 3 shows a timing diagram 300 for the various signals shown in FIGS. 2A and 2B. In the FIG. 2A and FIG. 2B embodiments, the input signals—DQS signal 211, DQS enable clock (clk) signal 212, and DQS enable signal 213—are processed by the 0.5T conversion and pulse gating circuit 202 to generate the gated clock-like signal 214. The DQS signal 211 is generated by a memory device (e.g., the memory unit 104 or I/O unit 106 of FIG. 1) in response to a read request. As shown in FIG. 3, there is a preamble period 302 in which the DQS signal 211 is driven low. The length of the preamble period 302 is greater than or equal to 90 percent of a clock period (per the DDR3 specification). Data is captured during the period 303. There is also a post-amble period 304 after the last falling edge of the DQS signal 211 in that signal is also driven low. The length of the post-amble period 304 is greater than or equal to 40 percent of the clock period (per the DDR3 specification). There are also periods 301 (before the preamble) and 305 (after the post-amble) during which the DQS signal 211 is tri-stated (indeterminate).

Thus, the circuitry 200 of FIGS. 2A and 2B can be used to track the variation of falling edges of the DQS signal 211, thereby enabling tracking of low-frequency drift of the DQS gating timing window. As will be discussed in conjunction with FIGS. 4 and 5 below, both the rising edges and the falling edges of the enable signal 214 can be used to sample the DQS signal 211 to locate both the rising edges and the falling edges of the DQS signal.

Continuing with reference to FIGS. 2A, 2B, and 3, the enable signal 214 is fed into the falling edge detector gating circuit 204 and generates the !gate signal 215. Depending on the exact timing alignment of the falling edge of the enable signal 214, it is possible for the falling edge detector gating circuit 204 to either find the falling edge and deassert the !gate signal 215, or miss the falling edge and leave the !gate signal 215 asserted. This is shown as a period 320 of uncertainty in the timing diagram of FIG. 3. However, this uncertainty is not problematic as the gating and the gate are not sensitized to this period of uncertainty as the other input (the DQS signal 211) is already low (zero).

With reference to FIGS. 2A and 2B, the delay chain (Δt) 220 is included on the signal line 205 from the DQS enable clock signal 212 to the AND gate 224. As part of a PLD (e.g., an FPGA), the circuitry 200 is programmable and, in the example of FIG. 2A, the mux 222 is configured as shown in the figure, in order to feed the DQS enable clock signal 212 to the AND gate 224. The delay chain 220 ensures that the clock pulse (the DQS enable clock signal 212) arrives at the AND gate 224 after the DQS enable signal 213 arrives at the AND gate 224, to prevent clipping of the DQS enable clock signal 212. The delay chain 220 is sized larger than the Tco (clock-to-out timing, which includes clock delay, clock-to-Q time, and data delay) of the register (flip-flop) 226 to ensure that the relationship between the signals 212 and 213 holds. A programmable delay element (ΔT) 240 delays the enable signal 214 pulses so that each pulse can be centered in a corresponding gating timing window.

The multi-sample phase detector 206 includes two sampling registers 252 and 254 (tracking phase detector flip-flops) that can sample the DQS signal 211 directly. Essentially, the sampling registers 252 and 254 sample, for example, the rising edges of the DQS signal 211 against a reference (enable signal 214) to determine whether the reference is late or early relative to the DQS signal. In the embodiments of FIGS. 2A and 2B, a fixed delay (Δ25; e.g., 25 pico-seconds) is included on the path to the register 254.

Figure 4:
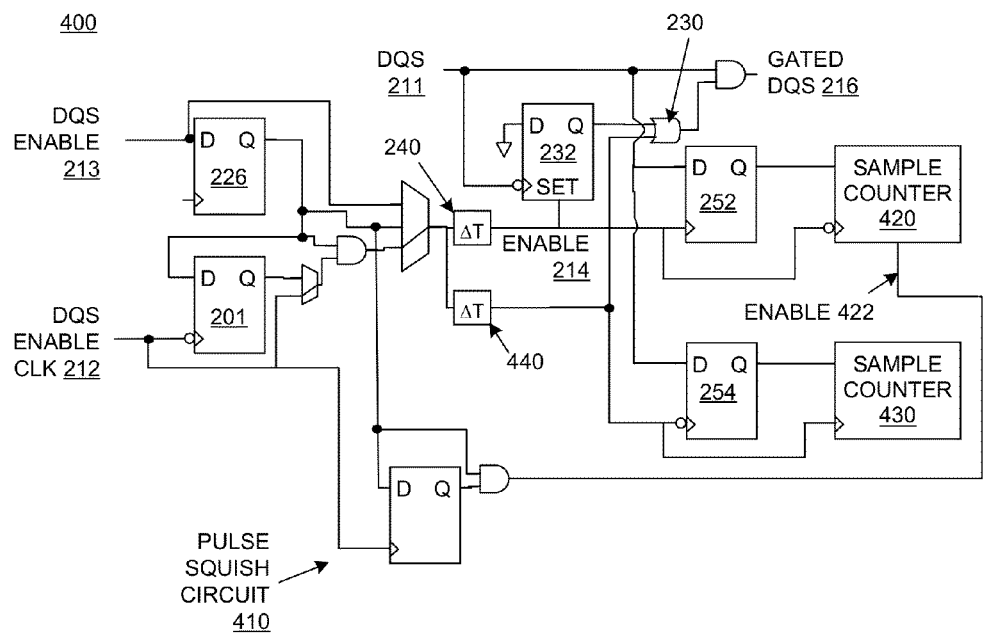
FIG. 4 illustrates tracking and gating circuitry that can be used in, for example, a memory interface circuit in another embodiment according to the present invention.

The use of two sampling registers allows more samples to be taken prior to performing any tracking updates, which in turn provides better jitter rejection as more averaging can be performed (in order to reject jitter, a large number of samples are preferred prior to making a decision as to which direction to adjust the programmable delay elements 240 and 440 of FIGS. 2A, 2B, and 4). Tracking is effective at reducing both the on-chip and off-chip variation seen in the DQS enable path, and is important for closing timing on high speed (e.g., DDR) memory interfaces. The addition of tracking can help reduce the effect of low-frequency variation, particularly the temperature and some voltage variation components. In the present embodiment, tracking is used to align the falling edge of the enable signal 214 to the rising edge of DQS signal 211.

In one embodiment, samples are collected with up/down counters (the up/down sample counters 420 and 430 of FIG. 4), which in turn are sampled periodically after a specified number of samples are taken. Depending on the logic value on the up/down (late/!early) input, the counter is incremented or decremented on, for example, the falling edge of the enable signal 214. An additional tracking manager (not shown) adjusts delay chain settings according to the numeric sign of the sample counter.

With reference to FIGS. 2A, 2B, and 3, there are four edges A, B, C, and D in the enable signal 214. Of these edges, edges A and D have the same timing alignments and requirements as prior art circuits. Edge C has the effect of either deasserting the gate signal 215, if it was previously asserted, or of holding constant the deassert signal if the gate signal 215 was previously already deasserted. The timing requirements for deasserting the gate signal 215 using edge C are the same as for edge A.

Edge B has the potential effect of allowing the falling edge detector 204 to gate the DQS signal 211 in the event that a falling DQS edge occurs before edge C can deassert the gate signal 215. In that case, the circuitry 200 functions the same as if the last falling edge in the burst 303 (e.g., edge D) deasserted the gate signal 215. By itself, this gating activity is safe as the circuitry 200 is gating an already low DQS signal 211.

If gating and ungating signals are generated separately, the DQS signal 211 is ungated first by the ungating pulse through the OR gate 230. Prior to deassertion of the ungating pulse, the rising edge of the gating pulse ideally traverses through the register (flip-flop) 232 and the OR gate 230. The relative time from the rising edge of the gating pulse to the falling edge of the ungating pulse is equal to:

0.5T−PLD (e.g., FPGA) duty cycle distortion (DCD)−memory DCD, or approximately 0.35T. Thus, for the embodiments of FIGS. 2A and 2B, the Tco of the register 232 and the effective setup time of the OR gate 230 are designed to be less than approximately 0.35T combined.

FIG. 4 illustrates tracking and gating circuitry 400 that can be used in, for example, a memory interface circuit (e.g., PLD 108 of FIG. 1) in another embodiment according to the present invention. The flip-flop 201 may or may not be included in the circuitry 400 as discussed above in conjunction with FIGS. 2A and 2B. In the circuitry 400, the enable signal 214 pulses that are used for gating and ungating are separately delayed using programmable delay elements 240 and 440, respectively, so that gating pulses can be centered in the gating timing window (within the full cycle preceding the last falling edge) and ungating pulses can be centered within the ungating timing window (centered within the 0.9T memory preamble) with good margin. This allows for improved timing in the presence of memory DCD. That is, the circuitry 400 can compensate for memory DCD variation that affects the relative position of the gating and ungating timing windows. The gating and ungating cycles are provided to the OR gate 230 for proper gating of the DQS signal 211.

The circuitry 400 includes up/down sample counter 420 and up/down sample counter 430. In the example of FIG. 4, the sample counter 420 counts falling edges of the DQS enable signal 211 using the rising edges of the enable signal 214 (gating), and the sample counter 430 counts the rising edges of the DQS enable signal 211 using the falling edges of the enable signal 214 (ungating). As mentioned above, the sample counters 420 and 430 are sampled periodically after a specified number of samples are taken, and a tracking update circuit (not shown) adjusts the programmable delay elements 240 and 440 according to the numeric sign of the sample counter.

Figure 5:
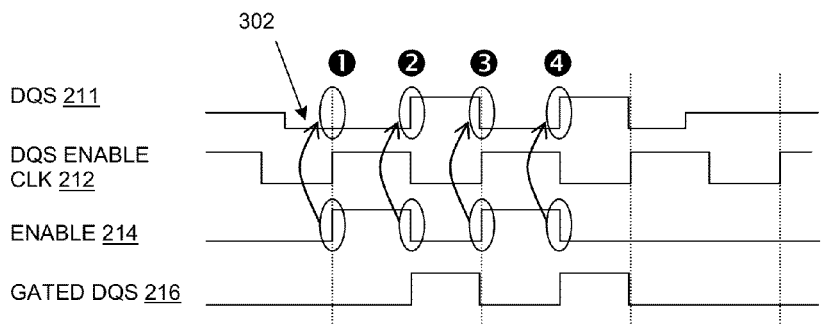
FIG. 5 shows a timing diagram for various signals in an embodiment according to the present invention.

With reference to FIGS. 4 and 5, the rising edges and the falling edges of the enable signal 214 can sample the DQS signal 211 to locate both the falling and rising edges of the DQS signal. In FIG. 4, edges 2 and 4 of the enable signal 214 track the rising edges of the DQS signal 211, and edge 3 tracks the falling edge of the DQS signal. Edge 1 of the enable signal 214 does not have a corresponding edge in the DQS signal 211 and is instead placed during the preamble 302.

To prevent the sample corresponding to edge 1 from being counted, the up/down counter 420 for falling DQS edges includes an enable input 422. The enable signal 422 is generated by the pulse squish circuit 410 from the DQS enable signal 213 and also using the DQS enable clock signal 212. In essence, the pulse squish circuit 410 shortens the DQS enable signal 213 by one full clock cycle and uses that signal to not enable the counter 420 for the first falling edge sample. Although the sample enable signal 422 is generated one full clock cycle after the first rising edge of the DQS signal 211, the pulsed DQS enable signal 214 can take longer to arrive at the gating circuitry 204 due to delays that may be inserted as part of the leveling process. Such delays can approach the order of one-half of a memory clock cycle. The design of the pulse squish circuit 410 ensures that the sample enable signal 422 arrives at the counter 420 after the latest possible arrival of the invalid first sample for the missing edge 1 of the DQS signal 211, and before the following rising edge of the DQS signal 211, which is to be counted. The timing conditions are satisfied provided the maximum value of the delay through the delay elements 240 and 440 is chosen to be less than approximately 0.5T.

However, there are alternatives that can be implemented in lieu of limiting the delay to 0.5T. For example, the opposite clock edge can be used to clock the falling edge counter 420. As another example, a state machine can be used to discard every other falling edge sample or every fourth falling edge sample. While this approach means some edges are not counted, it removes restrictions on the DQS post-amble delay.

As another example, instead of using pulse squish circuit 410 to generate the enable signal 422, an additional counter (not shown) can be utilized to count the total number of bursts based on the DQS enable signal 213; this is the number of "incorrect zeroes" sampled by the falling edge counter 420, which is the cumulative error in that counter. In one such embodiment, the pulse squish circuit 410 is not included in the circuitry 400, and instead the additional counter is connected to the DQS enable signal 213 input. In another such embodiment, the pulse squish circuit 410 is not included in the circuitry 400, and instead the additional counter is embedded within the logic that generates the DQS enable signal 213 and updates the delay chains 240 and 440 based on the sample counters 420 and 430. The additional counter essentially tracks how many incorrect samples have been recorded. The additional counter can be updated at the same time as the counter 420, and a tracking update circuit can compute a corrected sample count.

In one embodiment of the invention, the counters 420 and 430 saturate at a maximal or minimal value, and remain at that value until reset. This reduces the sizes of counters. In another embodiment, the synchronization logic and the counters 420 and 430 are implemented in soft logic.

Figure 6:
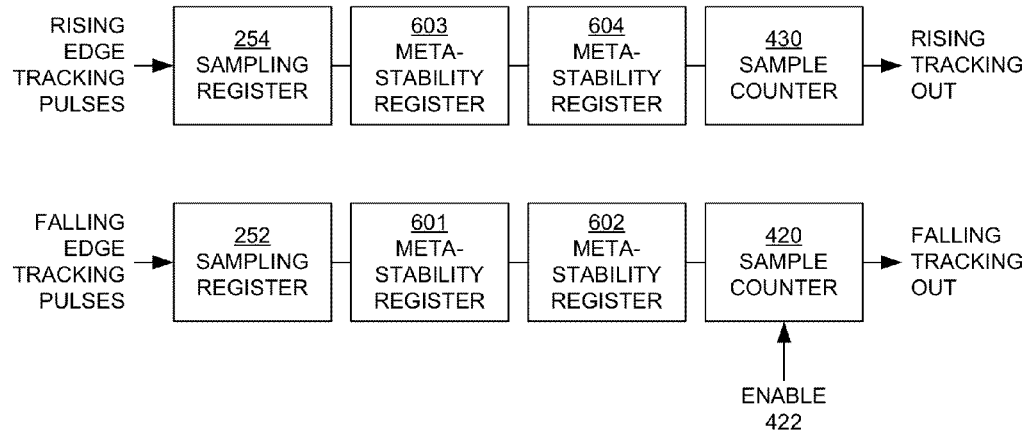
FIG. 6 illustrates elements of a memory interface circuit in another embodiment according to the present invention.

In another embodiment, metastability registers 601, 602, 603, and 604 are utilized between the sampling registers 252 and 254 and the corresponding counter 420, 430 as shown in FIG. 6. An equal number of metastability registers is added to the pulse enable generation circuitry to match the latency of the samples. Because the metastability registers are also clocked with the gated DQS signal 211, for every sample period, a small number of samples will be incorrect (stuck in the pipeline) but the total error in the system is acceptable.

As mentioned above, during operation, the DQS enable signal 214 pulses used for ungating and gating are separately delayed (using programmable delay elements 240 and 440, respectively) so each can be centered in the corresponding ungating and gating timing windows. This allows for improved timing in the presence of memory DCD. The falling edges of the DQS enable signal 214 pulses used for ungating can be used to sample the rising edges of the DQS signal 211; aligning the falling edges of the DQS enable signal 214 pulses used for ungating with rising edges of the DQS signal 211 places the rising edges of the DQS enable signal 214 pulses approximately in the center of the preamble timing window. The impact of DCD of the DQS enable clock 212 on the centering of the rising edge can be reduced through techniques well-known in the art.

However, when a falling edge of the DQS enable signal 214 is centered in the gating timing window, the rising edge of the DQS enable signal 214 is not necessarily aligned with the falling edge of the DQS signal 211 due to effects such as the DCD of the DQS enable clock 211 and imbalanced setup/hold requirements at the gating register 232 (FIG. 4). Consequently, the falling edges of the DQS signal 211 are tracked with a separately delayed DQS enable signal 214 pulse independent of those used for ungating and gating.

In one embodiment, three delay chain tap muxes and settings are used for separate gating/ungating and DQS signal 211 falling edge tracking: 1) DQS enable signal 214 pulses used for ungating (also used to sample and track rising edges of the DQS signal 211); 2) DQS enable signal 214 pulses used for gating; and 3) DQS signal 211 falling edge tracking (used to adjust DQS enable signal 214 pulses used for gating).

To avoid an area penalty from building a third delay chain tap mux to support these three settings, the two delay chain elements (taps) 240 and 440 can be used and repurposed when necessary. During operation, the two delay elements 240 and 440 have a first setting so they can be used to generate DQS gating and ungating pulses. During periodic sampling for tracking purposes, the two delay elements 240 and 440 have a second setting so they can be used for sampling the rising and falling edges of the DQS signal 211. In some embodiments, the DQS enable signal 214 pulses are used for gating to sample the DQS signal 211 falling edges, in which case the system can include provisions to return to a well-defined state if, for example, gating occurs a cycle too early or gating does not occur at all. Embodiments that only employ two taps also cannot perform DQS signal 211 falling edge sampling during read operations.

Figure 7:
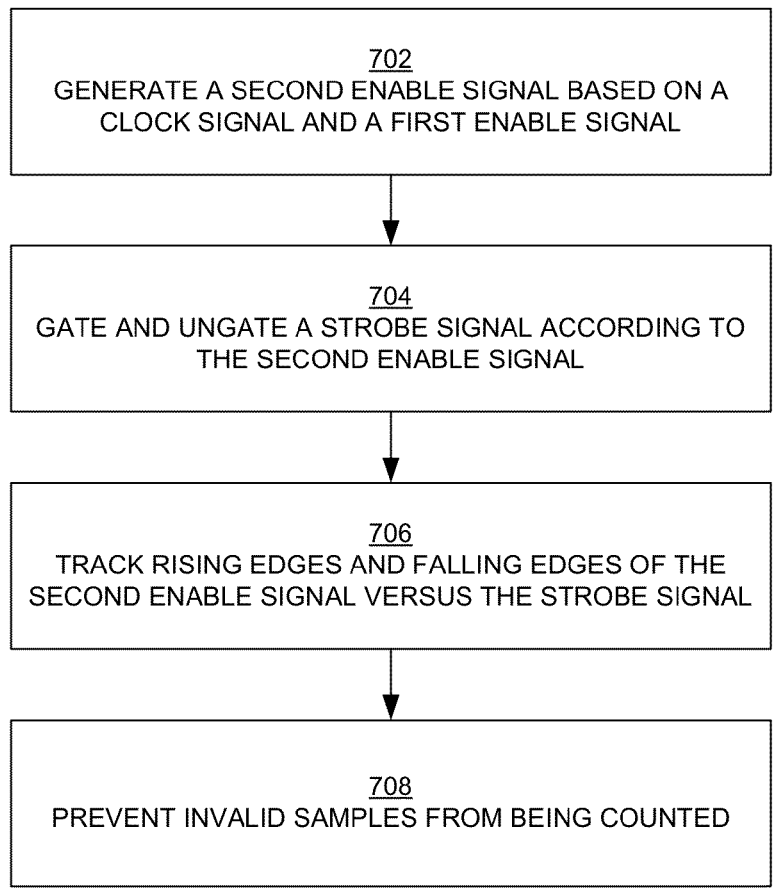
FIG. 7 is a flowchart of a method of gating and sampling a data strobe signal using a shared enable signal in an embodiment according to the present invention.

FIG. 7 is a flowchart 700 of a method of gating and sampling a data strobe signal using a shared enable signal in an embodiment according to the present invention. Although specific steps are disclosed in the flowchart 700, such steps are exemplary. That is, embodiments according to the present invention are well suited to performing various other steps or variations of the steps recited in the flowchart 700.

In block 702, with reference also to FIGS. 2A and 2B, a second enable signal (e.g., the enable signal 214) is generated based on a clock signal (e.g., the DQS enable clock signal 212) and a first enable signal (e.g., the DQS enable signal 213). In one embodiment, the first enable signal is provided to a first input of a logic gate (e.g., AND gate 224), and the clock signal is provided to a second input of the logic gate, where the first enable signal arrives at the logic gate before the clock signal. The second enable signal from the logic gate is output according to values of the first enable signal and the clock signal.

In block 704 of FIG. 7, a strobe signal (e.g., the DQS signal 211 of FIGS. 2A and 2B) is gated and ungated according to a value of the second enable signal.

In block 706 of FIG. 7, rising edges of the second enable signal are tracked versus the strobe signal, and falling edges of the second enable signal are tracked versus the strobe signal.

In block 708, invalid samples are prevented from being counted. In one embodiment, a third enable signal (e.g., the enable signal 422 of FIG. 4) is generated using the clock signal and the first enable signal. The third enable signal is used to control an up/down counter (e.g., the counter 420 of FIG. 4) that is configured to track the falling edges. In another embodiment, another (e.g., third) counter can be utilized to count the total number of bursts based on the first enable signal, and a tracking update circuit can compute a corrected sample count using the count from the third counter.

In summary, according to embodiments of the present invention, gating and tracking functionality can be implemented without the need for duplicate circuitry, reducing silicon area and cost. Also, falling and rising edges of the DQS can be independently tracked for increased margin, without significantly increasing hardware cost.

In contrast to conventional circuits, embodiments according to the present disclosure either enable a greater number of samples with comparable area, when compared against DQS gating using an enable signal, or provide an identical number of samples without the need for circuit duplication, when compared against DQS tracking with a free running clock using a mirror path. The ability to enable a greater number of samples in the same amount of time and area allows improvement to the performance of memory calibration and tracking algorithms. The ability to sample from multiple edges of regular read bursts is also a benefit. The reduced amount of logic, clocks, and signals required when compared to conventional solutions also provides a power savings in addition to the area savings.

Low-frequency variation in memory DCD can also be tracked, which can be useful for improving margins for DQS enable gating. The improvement in margin for a typical DDR3 device is approximately two percent of tCK (memory clock frequency).

Figure 8:
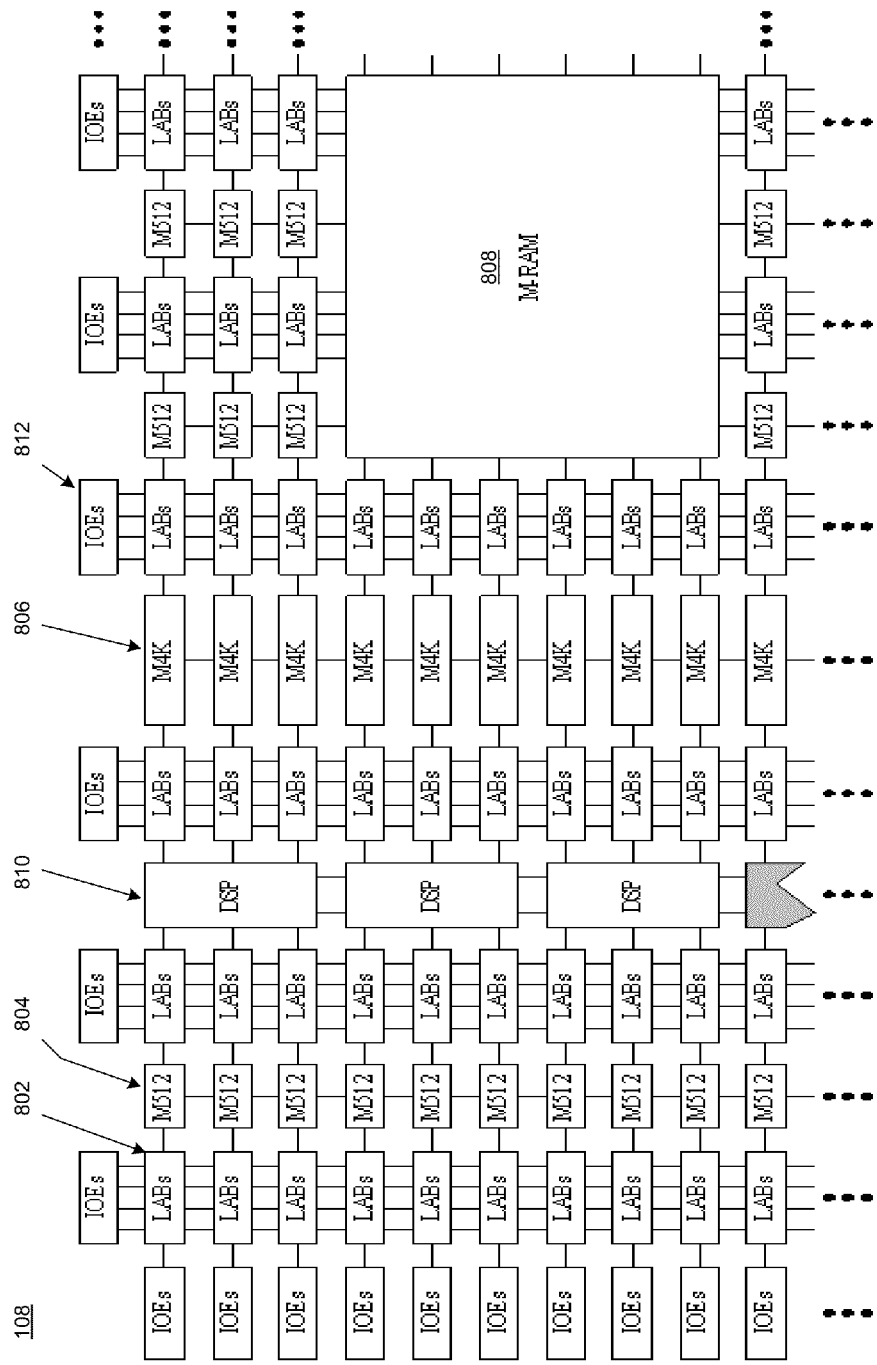
FIG. 8 is a block diagram of an example of a high-density PLD that can be used in a system that implements embodiments according to the present invention.

FIG. 8 is a block diagram of an example of a high-density PLD 108 that can be used in a system that implements embodiments according to the present invention. The PLD 108 includes a two-dimensional array of programmable logic array blocks (LABs) 802 that are interconnected by a network of column and row interconnects of varying length and speed. The LABs 802 include multiple (e.g., 10) logic elements (LEs) that implement user-defined logic functions. The PLD 108 also includes a distributed memory structure including RAM blocks of various sizes throughout the array. The RAM blocks include, for example, 512-bit blocks 804, 4K blocks 806, and an M-Block 808 providing 512K bits of RAM. These memory blocks may also include shift registers and FIFO (first-in first-out) buffers. The PLD 108 further includes digital signal processing (DSP) blocks 810 that can implement, for example, multipliers with add or subtract features. I/O elements (IOEs) 812 that are located, in this example, around the periphery of the device support the various single-ended and differential I/O standards. Embodiments according to the present invention are not limited to the PLD 108, and can be implemented using others types of PLDs.

In the foregoing specification, embodiments of the invention have been described with reference to numerous specific details that may vary from implementation to implementation. Thus, the sole and exclusive indicator of what is, and is intended by the applicant to be, the invention is the set of claims that issues from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A system comprising:
   a memory device configured to generate a data strobe signal in response to a read request; and
   a memory interface circuit coupled to said memory device, said memory interface circuit configured to generate a second enable signal using a clock signal and a first enable signal, said second enable signal operable for: gating and ungating said data strobe signal, and sampling rising edges and falling edges of said second enable signal to track said second enable signal against said data strobe signal; wherein said memory interface circuit comprises:
   a flip-flop operable to receive said clock signal and output said first enable signal to a first input of a logic gate;
   a signal line that feeds said clock signal directly to a second input of said logic gate; and
   a delay chain on said signal line and configured to cause said clock signal to arrive at said logic gate after said first enable signal, wherein said second enable signal is produced from said logic gate according to said first enable signal and said clock signal.

2. The system of claim 1 wherein said memory interface circuit further comprises a programmable first delay element coupled to an output of said logic gate, wherein said first delay element has a first setting that is used when said data strobe signal is being gated and a second setting that is used when said rising and falling edges of said second enable signal are being tracked.

3. The system of claim 2 wherein said memory interface circuit further comprises a programmable second delay element coupled to said output of said logic gate, wherein said second delay element has a first setting that is used when said data strobe signal is being ungated and a second setting that is used when said rising and falling edges of said second enable signal are being tracked.

4. The system of claim 1 wherein said memory interface circuit further comprises:
a first up/down counter coupled to a first sampling register and operable to track said falling edges, wherein said first up/down counter is controlled according to a third enable signal to prevent an invalid sample from being counted; and
a second up/down counter coupled to a second sampling register and operable to track said rising edges.

5. The system of claim 1 wherein said memory interface circuit further comprises:
a first up/down counter coupled to a first sampling register and operable to track said falling edges; and
a second up/down counter coupled to a second sampling register and operable to track said rising edges; and
a third counter configured to count instances of said first enable signal, wherein said count from said third counter is used to exclude an invalid sample from a count of said falling edges.

6. The system of claim 1 wherein said memory interface circuit comprises a programmable logic device.

7. A device comprising:
first circuitry operable to receive a clock signal and a first enable signal and generate a second enable signal;
second circuitry operable to gate and ungate a strobe signal according to said second enable signal; and
third circuitry operable to track both a rising edge and a falling edge of said second enable signal against said strobe signal.

8. The device of claim 7 wherein said first circuitry further comprises:
a flip-flop operable to receive said clock signal and output said first enable signal to a first input of a logic gate;
a signal line that feeds said clock signal directly to a second input of said logic gate; and
a delay chain on said signal line and configured to cause said clock signal to arrive at said logic gate after said first enable signal, wherein said second enable signal is produced from said logic gate according to said first enable signal and said clock signal.

9. The device of claim 8 further comprising a programmable first delay element coupled to said first circuitry, wherein said first delay element has a first setting for when said strobe signal is being gated and a second setting for when rising edges and falling edges of said second enable signal are being tracked.

10. The device of claim 9 further comprising a programmable second delay element coupled to said first circuitry, wherein said second delay element has a first setting for when said strobe signal is being ungated and a second setting for when said rising and falling edges of said second enable signal are being tracked.

11. The device of claim 7 wherein said third circuitry comprises:
a first up/down counter coupled to a first sampling register and operable to track falling edges of said second enable signal, wherein said first up/down counter is controlled according to a third enable signal to prevent an invalid sample from being counted; and
a second up/down counter coupled to a second sampling register and operable to track rising edges of said second enable signal.

12. The device of claim 7 further comprising:
a first up/down counter coupled to a first sampling register and operable to track falling edges of said second enable signal; and
a second up/down counter coupled to a second sampling register and operable to track rising edges of said second enable signal; and
a third counter coupled to said first circuitry and operable to count instances of said first enable signal, wherein said count from said third counter is used to exclude an invalid sample from a count of said falling edges.

13. The device of claim 7 further comprising:
memory coupled to said first circuitry, said second circuitry, and said third circuitry; and
an input/output unit coupled to said first circuitry, said second circuitry, and said third circuitry.

14. A method comprising:
generating a second enable signal based on a clock signal and a first enable signal;
providing said first enable signal to a first input of a logic gate;
providing said clock signal to a second input of said logic gate, wherein said clock signal arrives at said logic gate after said first enable signal;
outputting said second enable signal from said logic gate according to values of said first enable signal and said clock signal;
gating and ungating a strobe signal according to a value of said second enable signal;
tracking rising edges of said second enable signal versus said strobe signal; and
tracking falling edges of said second enable signal versus said strobe signal.

15. The method of claim 14 further comprising:
generating a third enable signal using said clock signal and said first enable signal; and
using said third enable signal to control an up/down counter that is configured to track said falling edges.

16. The method of claim 14 further comprising:
counting a number of instances of said first enable signal; and
using said number, excluding an invalid sample from a count of said falling edges.

17. The method of claim 14 further comprising:
using a first setting for a first delay element if said strobe signal is being gated; and
using a second setting for said first delay element if said rising and falling edges are being tracked.

18. The method of claim 17 further comprising:
using a first setting for a second delay element if said strobe signal is being gated; and
using a second setting for said second delay element if said rising and falling edges are being tracked.

* * * * *